United States Patent
Chen et al.

(10) Patent No.: US 11,242,596 B2
(45) Date of Patent: Feb. 8, 2022

(54) FILM FORMING METHOD

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Guangfei Chen, Beijing (CN); Dagang Liu, Beijing (CN); Feng Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 459 days.

(21) Appl. No.: 16/304,196

(22) PCT Filed: Apr. 13, 2018

(86) PCT No.: PCT/CN2018/082959
§ 371 (c)(1),
(2) Date: Nov. 23, 2018

(87) PCT Pub. No.: WO2018/223770
PCT Pub. Date: Dec. 13, 2018

(65) Prior Publication Data
US 2021/0222287 A1    Jul. 22, 2021

(30) Foreign Application Priority Data
Jun. 8, 2017   (CN) .......................... 201720660632.X

(51) Int. Cl.
*C23C 14/34*     (2006.01)
*C23C 14/56*     (2006.01)

(52) U.S. Cl.
CPC .............. *C23C 14/34* (2013.01); *C23C 14/56* (2013.01)

(58) Field of Classification Search
CPC ....... C23C 14/34; C23C 14/56; C23C 14/568; B05C 21/00; B05C 21/005; B05C 15/00; H01J 37/3488
(Continued)

(56) References Cited

U.S. PATENT DOCUMENTS 6,471,830 B1 * 10/2002 Moslehi ................ C23C 14/358
204/192.12
6,565,717 B1 * 5/2003 Leet ...................... H01J 37/321
204/192.12
(Continued)

FOREIGN PATENT DOCUMENTS

JP       H0353063 A  *  3/1991

OTHER PUBLICATIONS

JPH0353063A Translation (Year: 1991).*

*Primary Examiner* — James Lin
*Assistant Examiner* — Patrick S Ott
(74) *Attorney, Agent, or Firm* — Nath, Goldberg & Meyer; Joshua B. Goldberg

(57) ABSTRACT

The present disclosure discloses a film-forming device belongs to the field of film forming technology comprising: a film-forming chamber configured to form a film on a substrate disposed inside the film-forming chamber; a transfer assembly configured to transport a shielding plate into the film-forming chamber along a conveying path, move the shielding plate to a first position, and remove the shielding plate from the film-forming chamber along the conveying path; and a cleaning assembly disposed at the conveying path outside the film-forming chamber for cleaning the shielding plate removed from the film-forming chamber.

12 Claims, 3 Drawing Sheets

(58) Field of Classification Search
USPC .......................................................... 118/100
See application file for complete search history.

(56) References Cited

U.S. PATENT DOCUMENTS

| | | | | |
|---|---|---|---|---|
| 9,251,930 | B1* | 2/2016 | McNutt | H01B 11/002 |
| 2006/0048708 | A1* | 3/2006 | Hartig | C23C 14/185 |
| | | | | 118/715 |
| 2006/0192151 | A1* | 8/2006 | Bowering | G03F 7/70916 |
| | | | | 250/503.1 |
| 2010/0258144 | A1* | 10/2010 | Broz | H01L 21/67011 |
| | | | | 134/6 |
| 2012/0155994 | A1* | 6/2012 | Kishimoto | H01L 21/67736 |
| | | | | 414/217 |
| 2012/0164776 | A1* | 6/2012 | Rathweg | C23C 14/0629 |
| | | | | 438/57 |
| 2013/0327894 | A1* | 12/2013 | Bigelow | B64G 1/56 |
| | | | | 244/159.4 |
| 2015/0284842 | A1* | 10/2015 | Miyauchi | C23C 14/0047 |
| | | | | 204/298.03 |

\* cited by examiner

FILM FORMING METHOD

This is a National Phase Application filed under 35 U.S.C. 371 as a national stage of PCT/CN2018/082959, filed on Apr. 13, 2018, an application claiming the benefit of Chinese Application No. 201720660632.X, filed on Jun. 8, 2017, the content of each of which is hereby incorporated by reference in its entirety.

TECHNICAL FIELD

The present disclosure belongs to the field of film forming technology, and in particular relates to a film-forming device.

BACKGROUND

Sputtering film forming is a commonly used film-forming technique in the fields of display panels, touch screens, semiconductors, etc., in which a target material of a film-forming material is bombarded with argon ions in a vacuum sputtering chamber, thereby target particles are sputtered and deposited on a substrate (such as a glass substrate, a semiconductor substrate, etc.) to form a film layer.

In order to prevent contamination due to deposition of target particles which are sputtered outside the substrate on the chamber wall (wall of chamber) or the like, it is necessary to provide a shielding plate outside edges of the substrate so that the target particles sputtered outside the substrate are deposited on the shielding plate. As the sputtering film forming progresses, the target particles and dust deposited on a surface of the shielding plate are gradually increased, the adhesion ability of the shielding plate is deteriorated, and the target particles are easily dropped to deteriorate the quality of the film layer. Therefore, the shielding plate should be cleaned regularly.

SUMMARY

The present disclosure provides a film-forming device that can automatically clean a shielding plate.

The present disclosure provides a film-forming device comprising: a film-forming chamber, which is configured to form a film on a substrate disposed inside the film-forming chamber; a transfer assembly, which is configured to transport a shielding plate into the film-forming chamber along a conveying path, move the shielding plate to a first position, and remove the shielding plate from the film-forming chamber along the conveying path; and a cleaning assembly, which is disposed at the conveying path outside the film-forming chamber for cleaning the shielding plate removed from the film-forming chamber.

Optionally, the transfer assembly comprises: a plurality of conveyors, which are continuously disposed along the conveying path and are configured to carry and transport the shielding plate, each of the conveyors being independently controlled.

Optionally, the transfer assembly further comprises: at least one steering component, which is disposed on the conveying path for changing an orientation of the shielding plate.

Optionally, the steering component comprises: a steering platform for carrying the shielding plate; and a steering drive for rotating the steering platform.

Optionally, the transfer assembly comprises: a plurality of position sensors for detecting a position of the shielding plate.

Optionally, the film-forming device further comprises a plurality of shielding plates, each of the shielding plates comprising: a bottom part for contacting the transfer assembly; a top part opposite the bottom part; two side parts connected between the bottom part and the top part; and a front surface and a back surface surrounded by the bottom part, top part and two side parts, the front surface is configured to receive a film-forming material.

Optionally, the side parts of each one of the shielding plates are provided with a splicing structure for splicing with the side parts of the one of shielding plates adjacent thereto.

Optionally, at least one of the side parts of each one of the shielding plates is provided with an elastic block.

Optionally, the front surface of each one of the shielding plates is provided with a plurality of horizontal strips arranged in a horizontal direction.

Optionally, the cleaning assembly comprises a grinding component and a cleaning component, the cleaning component is farther away from the film-forming chamber than the grinding component along the conveying path; and the grinding component comprises: a grinding rod for extending into a gap between adjacent horizontal strips of each one of the shielding plates, and a grinding rod rotation drive for driving the grinding rod to rotate; the cleaning component comprises: a cleaning brush for extending into the gap between adjacent horizontal strips of each one of the shielding plates.

Optionally, the grinding component comprises a plurality of the grinding rods spaced apart in a vertical direction; the cleaning component comprises a plurality of the cleaning brushes spaced apart in a vertical direction.

Optionally, the grinding component further comprises an abrasive nozzle for spraying an abrasive to the grinding rod; the cleaning component further comprises a cleaning-agent nozzle for spraying a cleaning agent to the cleaning brush.

Optionally, the film-forming device further comprises: an unclean shielding plate storage assembly for storing the shielding plate that is removed from the film-forming chamber and is not cleaned; a cleaned shielding plate storage assembly for storing the shielding plate that has been cleaned; wherein, the transfer assembly is further configured to transport the shielding plate to the unclean shielding plate storage assembly and remove the shielding plate from the unclean shielding plate storage assembly, and transport the shielding plate to the cleaned shielding plate storage assembly and remove the shielding plate from the cleaned shielding plate storage assembly.

Optionally, the film-forming chamber is configured to be capable of being evacuated; a loading and unloading chamber capable of being evacuated is further provided at a junction of the transfer assembly and the film-forming chamber.

Optionally, the film-forming chamber is a sputtering chamber.

DETAILED DESCRIPTION OF THE EMBODIMENTS

Figure 1:
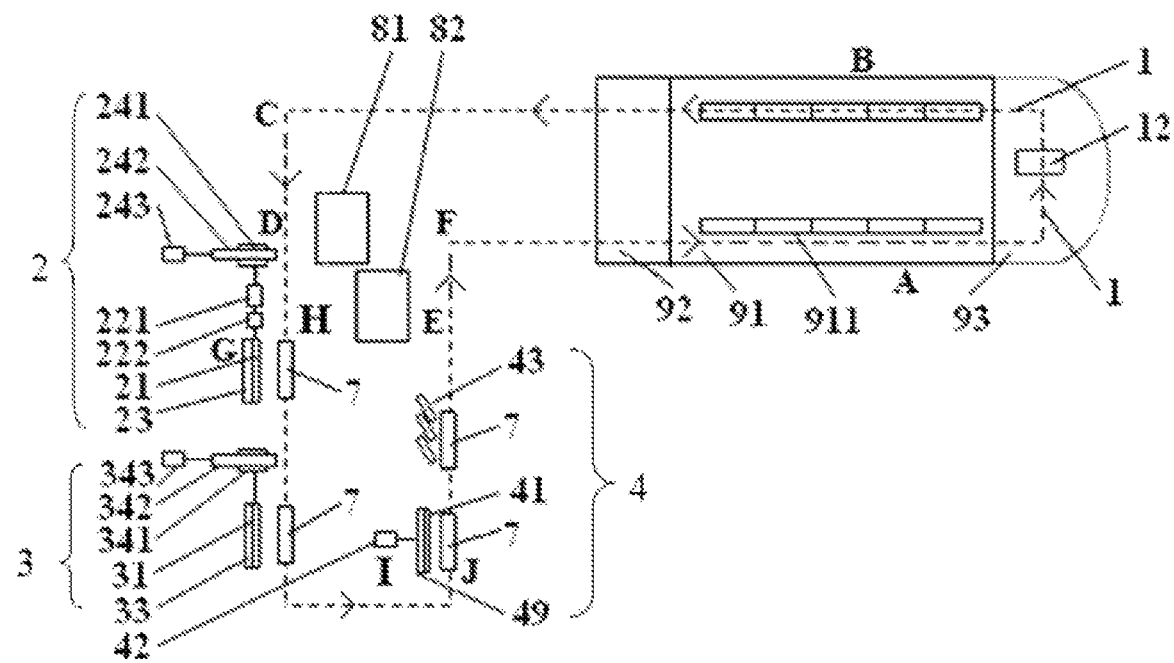
FIG. 1 is a schematic top view of a film-forming device according to an embodiment of the present disclosure.

The present disclosure will be further described in detail below in conjunction with the accompanying drawings and specific embodiments.

As shown in FIGS. 1 to 6, the present embodiment provides a film-forming device including a film-forming chamber 91 for forming a film on a substrate disposed inside thereof.

Here, the film-forming device refers to a device for forming a film layer on a glass substrate, a semiconductor substrate or the like, and the film-forming device is widely used in the fields of display panels, touch screens, semiconductors, and the like. The above film-forming process is carried out in the film-forming chamber 91, that is, the substrate should be placed in the film-forming chamber 91 to form a film layer.

Optionally, the film-forming chamber 91 is a sputtering chamber.

That is, the film-forming chamber 91 may be provided with a target material, an argon ion source, a magnetron system, etc., so that it is a sputtering chamber for performing sputtering (such as magnetron sputtering) film forming. Since the target ions are most easily sputtered into the region outside the substrate in the process of sputtering film forming, it is most necessary to provide a shielding plate 7, which is suitable for use in the present disclosure.

Definitely, the film-forming device (film-forming chamber) of the present embodiment is not limited thereto, and may be other types such as an evaporation device, a chemical vapor deposition device, and the like.

The film-forming device of the present disclosure further comprises: a transfer assembly, which is configured to transport a shielding plate 7 into the film-forming chamber 91 along a conveying path 1 and move the shielding plate 7 to a first position, and move the shielding plate 7 out of the film-forming chamber 91 along the conveying path 1; and a cleaning assembly, which is disposed at the conveying path 1 outside the film-forming chamber 91 for cleaning the shielding plate 7 removed from the film-forming chamber 91.

The transfer assembly can transport the shielding plate 7 along the conveying path 1 to a predetermined first position in the film-forming chamber 91 (such as outside the edge of the substrate) to receive the film-forming material that is sputtered outside the substrate, so as to avoid forming film layers on the wall of the chamber or the like to cause contamination. After a certain period of film formation, the transfer assembly can move the shielding plate 7 out of the film-forming chamber 91 along the conveying path 1 and transport it to the cleaning assembly, which then cleans the shielding plate 7.

The film-forming device of the present embodiment is provided with a transfer assembly and a cleaning assembly, so that the shielding plate 7 can be automatically removed from the film-forming chamber 91 and cleaned, and then the clean shielding plate 7 is automatically sent into the film-forming chamber 91. Therefore, the cleaning process of the shielding plate 7 is completely automated, no manual operation is required, the workload and labor-cost can be reduced, and problems such as the loss of parts and the inaccurate position of the shielding plate 7 caused by manual operation can be avoided. The operator does not have to contact with harmful substances such as dust, which improves the working environment; meanwhile, operation efficiency is greatly improved, and the equipment utilization rate is also improved.

Optionally, the film-forming chamber 91 may be configured to be evacuated; a loading and unloading chamber 92 capable of being evacuated is further provided at a junction of the transfer assembly and the film-forming chamber 91.

Various film-forming processes (such as sputtering) are performed under vacuum, so the film-forming chamber 91 can be evacuated. In this case, the loading and unloading chamber 92 can be provided at the junction of the transfer assembly and the film-forming chamber 91, that is, the shielding plate 7 needs to pass through the loading and unloading chamber 92 then the shielding plate 7 can be moved into or out of the film-forming chamber 91. Since the loading and unloading chamber 92 can be evacuated, when the shielding plate 7 is replaced, the loading and unloading chamber 92 can be evacuated, and then the shielding plate 7 can be moved between the loading and unloading chamber 92 and the film-forming chamber 91 which are both in the vacuum. After the movement is completed, disconnecting the loading and unloading chamber 92 and the film-forming chamber 91 and the vacuum of the loading and unloading chamber 92 is broken. Therefore, in the process of replacing the shielding plate 7, the vacuum of the loading and unloading chamber 92 with a relatively small dimension is applied or broken; while the film-forming chamber 91 can be kept in a vacuum state (the temperature and pressure thereof are substantially stabilized). This can significantly reduce downtime and re-entry time and increase equipment utilization rate.

Optionally, the film-forming device of the present embodiment further comprises a plurality of shielding plates 7, each of the shielding plates 7 comprises:

a bottom part for contacting the transfer assembly;

a top part opposite the bottom;

two side parts connected between the bottom part and the top part; and a front surface and a back surface surrounded by the bottom part, top part and two side parts, the front surface is configured to form the film.

Figure 3:
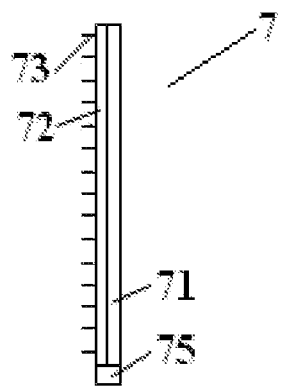
FIG. 3 is a schematic side view of a shielding plate of a film-forming device according to an embodiment of the present disclosure.
Figure 4:
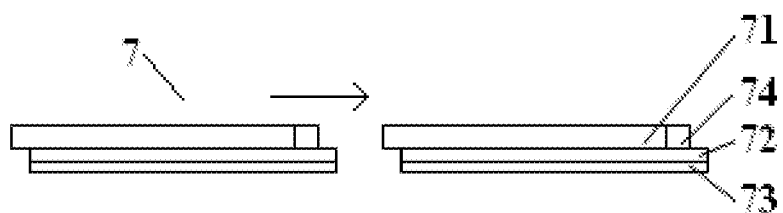
FIG. 4 is a schematic top view of a shielding plate of a film-forming device according to an embodiment of the present disclosure.

As shown in FIGS. 3 and 4, in the film-forming device of the present embodiment, the shielding plate 7 is no longer fixedly mounted, but is "placed" on the transfer assembly and can be transported to a desired position by the transfer assembly.

Optionally, the side parts of each one of the shielding plates 7 are provided with a splicing structure for splicing with the side parts of the other one of shielding plates 7 adjacent thereto. Optionally, at least one side of each one of the shielding plates 7 is provided with an elastic block 74.

In order to achieve the predetermined size and shielding effect of the shielding plate 7, the plurality of shielding plate 7 can be "spliced" together in side contact. Therefore, as shown in FIG. 4, the side parts of each one of the shielding plates 7 may be provided with a splicing structure (such as matching convex portions and concave portions). When the side parts of two shielding plates 7 are brought into contact with each other, they can be more stably combined and the film-forming material is prevented from passing through the gap between these two shielding plates 7. Further, in order to prevent damage due to collision when the shielding plate 7 is spliced, the side parts of each one of the shielding plates 7 may be provided with an elastic block 74.

Optionally, the front surface of each one of the shielding plates 7 is provided with a plurality of horizontal strips 73 arranged in a horizontal direction.

As shown in FIG. 3, on the front surface of the shielding plate 7 for depositing the film-forming material, a plurality of horizontal strips 73 (equivalent to protrusions) arranged in parallel may be provided. On the one hand, an adhering area of the shielding plate 7 is greatly increased. On the other hand, when the film-forming material deposited on the front surface of the shielding plate 7 is dropped, the dropped material would fall on the horizontal strip 73 without falling into the film-forming chamber 91, hence contamination can be avoided.

Specifically, as shown in FIG. 4, each of the shielding plates 7 may include a plate-shaped base 71 and a vertical strip 72, and the vertical strip 72 is attached to a surface of the base 71. The edges of the two are staggered, thereby the side parts of the shielding plates 7 are formed into the splicing structure described above. The elastic block 74 is attached to one side of the base 71 to serve as a buffer. The bottoms of the base 71 and the vertical strip 72 are connected to the slider 75, and the slider 75 is configured to contact the transfer assembly. A plurality of horizontal strips 73 are provided on the front side of the vertical strips 72 at equal intervals. The surfaces of the vertical strip 72 and the horizontal strips 73 are of a high-roughness shape to improve the adhesion of the film-forming material there on.

Optionally, the transfer assembly comprises: a plurality of conveyors 11, which are continuously disposed along the conveying path 1 and are configured to carry and transport the shielding plate 7, each of the conveyors 11 being independently controlled.

That is to say, the transfer assembly is optionally not a separate conveyor belt, but is constituted by a plurality of conveyors 11 (such as conveyor belts) which are continuously arranged and can be separately controlled. The plurality of conveyors 11 are connected end to end to transport the shielding plate 7 to the desired position. Thus, the movement of the different shielding plates 7 is independent of each other. For example, when one of the shielding plates 7 is sent to the first position, the movement thereof can be stopped, while the other conveyors 11 continue to send the another shielding plate 7 to the side part of the shielding plate 7 that is located at the first position. Those two shielding plates 7 are brought into contact, thereby completing the splicing of the shielding plates 7.

Specifically, each of the conveyors 11 may include a roller 111 and a belt 112 that is sleeved on the roller 111, and a motor is used to drive the roller 111 to rotate the belt 112.

Optionally, the transfer assembly comprises a plurality of position sensors 19 for detecting a position of the shielding plate 7.

Figure 2:
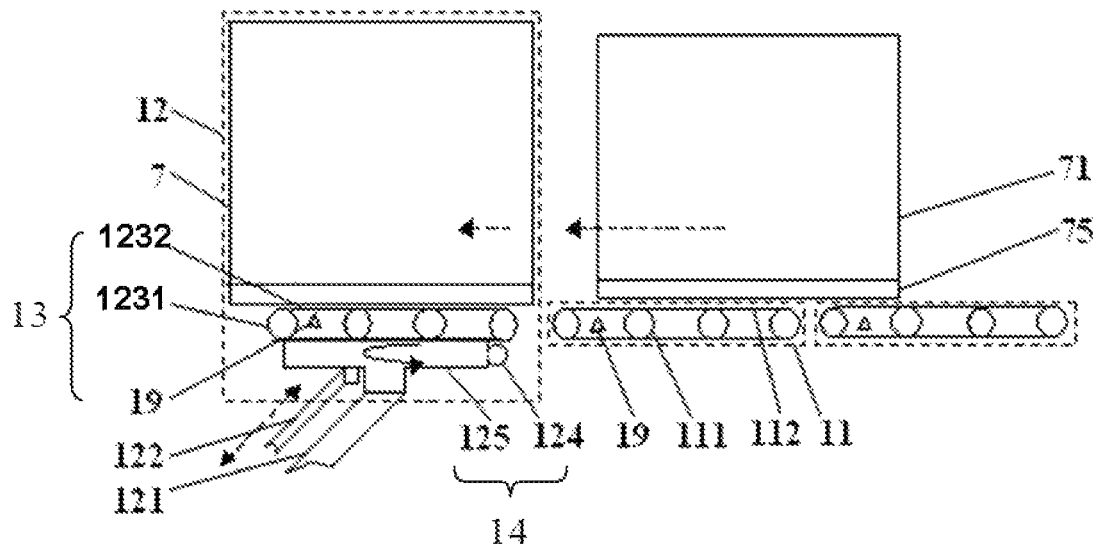
FIG. 2 is a schematic side view of a conveyor and a steering component of a film-forming device according to an embodiment of the present disclosure.

As shown in FIG. 2, a plurality of position sensors 19 may be provided in the transfer assembly (e.g., conveyor 11, steering component 12) for determining the position of the shielding plate 7, thereby control the operational state of the transfer assembly.

Optionally, the transfer assembly further comprises at least one steering component 12, which is disposed on the conveying path 1 for changing an orientation of the shielding plate 7. Furthermore, the steering component 12 comprises: a steering platform 13 for carrying the shielding plate 7; and a steering drive 14 for rotating the steering platform 13.

As described above, the shielding plate 7 has a front surface and a back surface. As shown in FIG. 1, a substrate carrier 911 for fixing the substrate is provided on the side A and the side B of the film-forming chamber 91, and the shielding plate 7 is required to be disposed adjacent to the substrate carrier 911. Thus, the front surfaces of the shielding plates 7 on the side A and the side B should both face the middle of the film-forming chamber 91 (that is, the orientation of the two should be opposite to each other). Therefore, when the shielding plate 7 is moved from the side A to the side B, its orientation needs to be rotated by 180°, so that a corresponding steering component 12 can be provided in the steering chamber 93.

Specifically, as shown in FIG. 2, the steering component 12 includes a slide rail 121 and a steering platform 13 that is movable along the slide rail 121 by the steering belt 122. The steering platform 13 is similar in structure to the conveyor 11, and may include a roller 1231, a belt 1232, a position sensor 19, and the like. The steering drive 14 may include a driving gear 124 and a driven gear 125, and the steering platform 13 is driven by the driving gear 124 and the driven gear 125. Wherein, the shielding plate 7 can be moved to the steering platform 13 by the conveyor 11, and the steering platform 13 is moved along the slide rail 121, while the steering drive 14 drives the steering platform to rotate, so as to dock the steering platform with the subsequent conveyor 11. The shielding plate 7 then enters the subsequent conveyor 11 as the steering platform rotates (i.e., orientation is changed).

The specific position, number, structure, and the like of the steering component 12 can be set as needed. For example, in order to a more rational layout for the conveying path 1 to reduce the overall area of the conveying path 1, a plurality of steering components (not shown) may be provided outside the film-forming chamber 91, so as to change the different positions of the conveying path to lateral direction or longitudinal direction.

Optionally, the cleaning assembly comprises a grinding component 2 and a cleaning component 3, the cleaning component 3 is farther away from the film-forming chamber 91 than the grinding component 2 along the conveying path 1.

As shown in FIG. 1, the cleaning assembly may include a grinding component 2 for grinding the shielding plate 7 and a cleaning component 3 for cleaning the shielding plate 7 that is polished. Most of the film-forming material adhering to the shielding plate 7 can be removed by grinding, and the subsequent cleaning further removes a small amount of adhered particles or the like.

The grinding component 2 includes: a grinding rod 21 for extending into a gap between adjacent horizontal strips 73 of each one of the shielding plates 7, and a grinding rod rotation drive 22 for driving the grinding rod 21 to rotate. Optionally, the grinding component 2 includes a plurality of the grinding rods 21 spaced apart in a vertical direction. Optionally, the grinding component 2 further includes an abrasive nozzle 23 for spraying an abrasive to the grinding rod 21.

Figure 5:
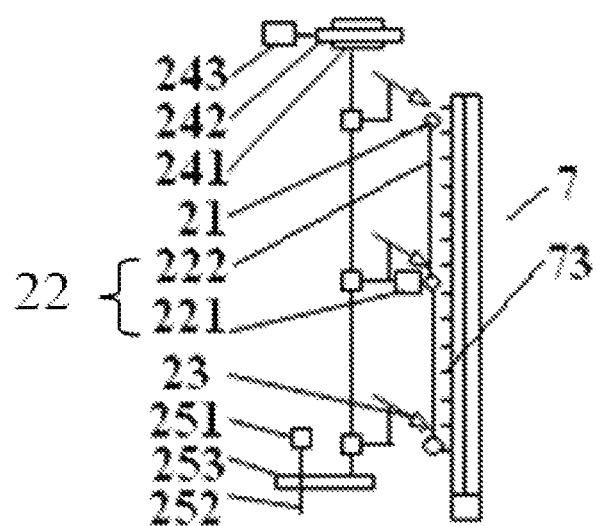
FIG. 5 is a schematic side view of a grinding component of a film-forming device according to an embodiment of the present disclosure.

As shown in FIG. 5, the grinding component 2 can abrade the film-forming material on the shielding plate 7 by inserting the grinding rod 21 between the horizontal strips 73 and rotating the grinding rod 21. Definitely, the grinding component 2 may include a plurality of grinding rods 21 which are spaced apart from each other. The plurality of grinding rods 21 can be inserted into the gaps between the different horizontal strips 73 simultaneously for grinding, so as to improve the grinding efficiency. In order to improve the grinding effect and lower the temperature, an abrasive nozzle 23 may be provided for spraying the abrasive to the grinding rod 21.

Specifically, as shown in FIG. 5, the grinding component 2 may include a plurality of grinding rods 21 arranged at equal intervals in parallel. The surface of the grinding rod 21 is made of a material having a high hardness and is formed to a cylindrical shape, and the abrasive nozzle 23 is disposed adjacent to the grinding rod 21. Each of the grinding rods 21 is connected to a grinding rod rotation drive. The grinding rod rotation drive 22 is composed of a motor 221 and a coupling 222 for driving the grinding rod 21 to rotate.

The grinding component 2 may also include a grinding rod horizontal drive and a grinding rod vertical drive. The grinding rod horizontal drive is composed of a nut 241, a lead screw 242, and a motor 243, etc. The lead screw 242 drives the grinding rod 21 and the grinding rod rotation drive to move in the horizontal direction by the motor 243. The grinding rod 21 is driven to rapidly move between the H position (working area) for grinding the shielding plate 7 and the G position (avoiding area) for avoiding the shielding plate 7. When the grinding rod 21 is ground, it moves slowly on the surface of the shielding plate 7. The grinding rod vertical drive may include a motor 251, a lead screw 252, a support plate 253, etc. The support plate 253 is internally threaded, and the support plate 253 and the lead screw 252 constitute a motion pair. The motor 251 can drive the grinding rod horizontal drive and the grinding rod 21 to move vertically as a whole by the lead screw 252, so as to align the grinding rod 21 with the gaps (space) between the different horizontal strips 73.

The cleaning component 3 includes a cleaning brush 31 for extending into the gap between adjacent horizontal strips 73 of each one of the shielding plates 7. Optionally, the cleaning component includes a plurality of the cleaning brushes 31 spaced apart in a vertical direction. Optionally, the cleaning component further includes a cleaning-agent nozzle 33 for spraying a cleaning agent to the cleaning brush 31.

The cleaning component 3 has a structure similar to that of the grinding component, except that the cleaning component 3 protrudes into the gap of the horizontal strips 73 instead of the grinding rod 21, but the cleaning brush 31 for performing the brushing. Definitely, the cleaning brush 31 may alternatively be provided in plurality and a plurality of cleaning brushes 31 are equally spaced in the vertical direction. A cleaning-agent nozzle 33 may be provided to spray the cleaning agent (such as high pressure spraying) to the cleaning brush 31.

Figure 6:
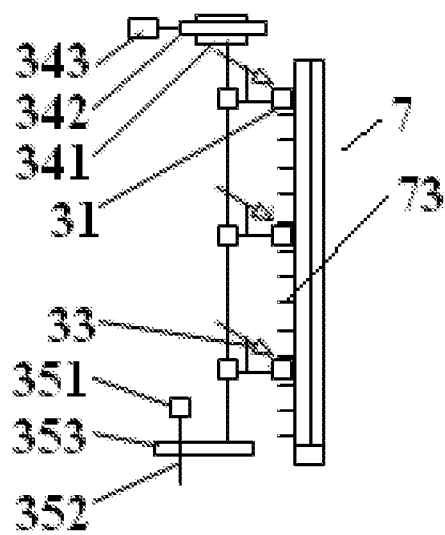
FIG. 6 is a schematic side view of a cleaning component of a film-forming device according to an embodiment of the present disclosure.

Specifically, as shown in FIG. 6, the cleaning brush 31 may be a rectangular parallelepiped. The height of the cleaning brush 31 can be the same as the distance between the two horizontal strips 71 of the shielding plate 7, and the width of the cleaning brush 31 can be the same as the width of the horizontal strip 73, and the length of the cleaning brush 31 is slightly longer than the length of the shielding plate 7. Being different from the grinding component, the cleaning brush 31 does not have to be rotated, but is pressed against the shielding plate 7 in the case where the cleaning brush 31 moves relative to the shielding plate 7. The particles on the surface of the shielding plate 7 are further cleaned by the action of the cleaning agent.

The cleaning component 3 may also include a cleaning brush horizontal drive and a cleaning brush vertical drive. The cleaning brush horizontal drive is composed of a nut 341, a lead screw 342, a motor 343, etc. The lead screw 342 can drive the cleaning brush 31 to move in the horizontal direction by the motor 343, that is, the cleaning brush 31 is driven to rapidly move between a working area for cleaning the shielding plate 7 and an avoiding area for avoiding the shielding plate 7. The cleaning brush vertical drive may include a motor 351, a lead screw 352, a support plate 353, and the like. The support plate 353 is internally threaded, and the support plate 353 and the screw 352 constitute a motion pair. The motor 351 can drive the cleaning brush 31 and the cleaning brush horizontal drive to move vertically as a whole by the screw 352, so as to align the cleaning brush 31 with the gaps (space) between the different horizontal strips 73.

Optionally, the cleaning assembly may further include a drying module 4, the drying module 4 is farther away from the film-forming chamber 91 than the cleaning component 3 along the conveying path 1, so as to dry the shielding plate 7 that has been cleaned.

Specifically, the drying module 4 may include a water absorbing plate 41. The water absorbing plate 41 may be composed of a high-elastic water absorbing material such as a sponge or a desiccant, and may be fixed on the bottom plate 49. The bottom plate 49 may be connected to the cylinder 42. The cylinder 42 may drive the water absorbing plate 41 to move horizontally by the bottom plate 49, so as to make the water absorbing plate 41 in close contact with the surface of the shielding plate 7 to absorb the moisture remaining on the surface of the shielding plate 7. At the same time, the drying module 4 may further include a hot-air dryer connected to a plurality of hot-air nozzles 43 for ejecting a high temperature, dry inert gas, so as to further dry the shielding plate 7.

Optionally, the film-forming device further comprises:

an unclean shielding plate storage assembly 81 for storing the shielding plate 7 that is removed from the film-forming chamber 91 and is not cleaned;

a cleaned shielding plate storage assembly 82 for storing the shielding plate 7 that has been cleaned;

the transfer assembly is further configured to feed the shielding plate 7 to the unclean shielding plate storage assembly 81 and remove the shielding plate 7 from the unclean shielding plate storage assembly 81, and feed the shielding plate 7 to the cleaned shielding plate storage assembly 82 and remove the shielding plate 7 from the cleaned shielding plate storage assembly 82.

As shown in FIG. 1, the shielding plate 7 to be cleaned and the shielding plate 7 that has been cleaned can be temporarily stored in the unclean shielding plate storage assembly 81 and cleaned shielding plate storage assembly 82 respectively, before they enter a subsequent process (such as being cleaned or entering the film-forming chamber 91). The structures of the unclean shielding plate storage assembly 81 and cleaned shielding plate storage assembly 82 may be the same with a plurality of storage tanks. The transfer assembly is provided with a motor, a roller, a belt, a position sensor 19, and etc. corresponding to each of storage tanks for sequentially transporting the shielding plates 7 one by one into or out of the storage tanks.

In the film-forming device of the present embodiment, the operator can control the operation of the transfer assembly, the cleaning assembly, and the like through a unified human-machine interface to realize automatic cleaning and replacement of the shielding plate 7. For example, if the operator sets the desired cleaning cycle, the film-forming device can automatically replace the shielding plate 7 when the cleaning cycle is reached according to the following procedure:

After the cleaning cycle is reached, the transfer assembly is activated, and the conveyor 11 drives the shielding plate 7 into the loading and unloading chamber 92 along the conveying path 1 (the shielding plate 7 on the side A of the film-forming chamber 91 needs to reach the side B through the steering component 12, then enter to the loading and unloading chamber 92), and then the loading and unloading chamber 92 removes the vacuum and is opened.

The shielding plate 7 is removed from the loading and unloading chamber 92, continues to enter the C position along the conveying path 1 and is turned to 90°; then enters the conveying path 1 in a longitudinal direction and reaches the D position; and then feeds the shielding plate 7 to the unclean shielding plate storage assembly 81 with cooperation of the motor, the roller, the belt and the like of the storage tank of the unclean shielding plate storage assembly 81.

At the same time, the shielding plate 7 in the cleaned shielding plate storage assembly 82 is removed from the E position, enters the F position, turns to 90°, then enters the conveying path 1 in the lateral direction; and then sent to the loading and unloading chamber 92 by the respective conveyors 11. The loading and unloading chamber 92 is evacuated and then is in communication with the film-forming chamber 91. The shielding plate 7 is moved to the first position of the film-forming chamber 91 one by one (the shielding plate 7 on the side B needs to pass through the side A and the steering component 12 in advance), wherein the elastic block 74 serves as a buffer when the shielding plates 7 which are in contact with each other are spliced.

The shielding plates 7 stored in the unclean shielding plate storage assembly 81 are removed one by one, and enter the position (corresponding to the grinding component) along the conveying path 1. The grinding rod vertical drive adjusts the grinding rod 21 to a suitable height, and the grinding rod horizontal drive drives the grinding rod 21 from the G position to the H position. The grinding rod 21 extends into the gap between the adjacent horizontal strips 73 and starts to rotate; then the abrasive nozzle 23 spray the abrasive, so as to remove the film-forming material at the corresponding position. The grinding rod horizontal drive returns the grinding rod 21 from the H position to the G position. The grinding rod vertical drive adjusts the grinding rod 21 to a position corresponding to another gap of the other horizontal strips 73 with repeating the previous steps until all of the gaps between the horizontal strips 73 are processed by grinding.

The shielding plate 7 continues to move to the position corresponding to the cleaning component. The cleaning component sequentially cleans the gaps between the horizontal strips 73 by the cleaning brush 31 in a manner similar to the grinding component, and cleans the film-forming material remaining on the shielding plate 7.

The shielding plate 7 moves to the drying module after being turned 180° through the steering component 12. The cylinder 42 drives the water absorbing plate 41 to move from the I position to the J position, so as to absorb the moisture remaining on the shielding plate 7; after that, the hot-air nozzle 43 ejects a high-temperature, dry inert gas to further dry the shielding plate 7.

After the cleaning of the shielding plates 7 is completed, the shielding plates 7 continuously enter the storage tanks of the cleaned shielding plate storage assembly 82 in order, and prepare for being sent to the film-forming chamber 91 in the next time of replacing the shielding plates 7.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

What is claimed is:

1. A film-forming device comprising:
   a film-forming chamber, which is configured to form a film on a substrate disposed inside the film-forming chamber;
   a transfer assembly, which is configured to transport a shielding plate into the film-forming chamber along a conveying path, move the shielding plate to a first position, and remove the shielding plate from the film-forming chamber along the conveying path; and
   a cleaning assembly, which is disposed at the conveying path outside the film-forming chamber for cleaning the shielding plate removed from the film-forming chamber
   wherein the film-forming device further comprise a plurality of shielding plates, each of the shielding plates comprising:
   a bottom part for contacting the transfer assembly;
   a top part opposite the bottom part;
   two side parts connected between the bottom part and the top part; and
   a front surface and a back surface surrounded by the bottom part, the top part and the two side parts, wherein the front surface is configured to receive a film-forming material;
   the front surface of each one of the shielding plates is provided with a plurality of horizontal strips arranged in a horizontal direction;
   the cleaning assembly comprises a grinding component and a cleaning component, and the cleaning component is farther away from the film-forming chamber than the grinding component along the conveying path;
   the grinding component comprises:
   a grinding rod for extending into a gap between the adjacent horizontal strips of each one of the shielding plates, and a grinding rod rotation drive for driving the grinding rod to rotate; and
   the cleaning component comprises:
   a cleaning brush for extending into the gap between the adjacent horizontal strip of each one of the shielding plates.

2. The film-forming device according to claim 1, wherein the transfer assembly comprises:
   a plurality of conveyors, which are continuously disposed along the conveying path and are configured to carry and transport the shielding plate, with each of the conveyors being independently controlled.

3. The film-forming device according to claim 2, wherein the transfer assembly further comprises:
   at least one steering component, which is disposed on the conveying path for changing an orientation of the shielding plate.

4. The film-forming device according to claim 3, wherein the steering component comprises:
   a steering platform for carrying the shielding plate; and
   a steering drive for rotating the steering platform.

5. The film-forming device according to claim 1, wherein the transfer assembly comprises:
   a plurality of position sensors for detecting a position of the shielding plate.

6. The film-forming device according to claim 1, wherein the side parts of each one of the shielding plates are provided with a splicing structure for splicing with the side parts of the one of shielding plates adjacent to the each one of the shielding plates.

7. The film-forming device according to claim 6, wherein at least one of the side parts of each one of the shielding plates is provided with an elastic block.

8. The film-forming device according to claim 1, wherein the grinding component comprises a plurality of the grinding rods spaced apart in a vertical direction;
the cleaning component comprises a plurality of the cleaning brushes spaced apart in a vertical direction.

9. The film-forming device according to claim 1, wherein the grinding component further comprises an abrasive nozzle for spraying an abrasive to the grinding rod;
the cleaning component further comprises a cleaning-agent nozzle for spraying a cleaning agent to the cleaning brush.

10. The film-forming device according to claim 1, further comprising:
an unclean shielding plate storage assembly for storing the shielding plate that is removed from the film-forming chamber and is not cleaned;
a cleaned shielding plate storage assembly for storing the shielding plate that has been cleaned;
wherein, the transfer assembly is further configured to transport the shielding plate to the unclean shielding plate storage assembly and remove the shielding plate from the unclean shielding plate storage assembly, and transport the shielding plate to the cleaned shielding plate storage assembly and remove the shielding plate from the cleaned shielding plate storage assembly.

11. The film-forming device according to claim 1, wherein the film-forming chamber is configured to be capable of being evacuated;
a loading and unloading chamber capable of being evacuated is further provided at a junction of the transfer assembly and the film-forming chamber.

12. The film-forming device according to claim 1, wherein the film-forming chamber is a sputtering chamber.

* * * * *